United States Patent
Liu et al.

(10) Patent No.: US 10,367,004 B2
(45) Date of Patent: Jul. 30, 2019

(54) VERTICAL FERROELECTRIC THIN FILM STORAGE TRANSISTOR AND DATA WRITE AND READ METHODS THEREOF

(71) Applicant: NuStorage Technology Co., Ltd., Apia (WS)

(72) Inventors: Fu-Chou Liu, Hsin-Chu County (TW); Yung-Tin Chen, Taoyuan (TW)

(73) Assignee: NUSTORAGE TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 15/954,864

(22) Filed: Apr. 17, 2018

(65) Prior Publication Data
US 2019/0181147 A1 Jun. 13, 2019

(30) Foreign Application Priority Data
Dec. 8, 2017 (CN) .......................... 2017 1 1293836

(51) Int. Cl.
*H01L 27/1159* (2017.01)
*H01L 29/51* (2006.01)
(Continued)

(52) U.S. Cl.
CPC ........ *H01L 27/1159* (2013.01); *G11C 11/223* (2013.01); *G11C 11/2273* (2013.01); *G11C 11/2275* (2013.01); *H01L 27/11597* (2013.01); *H01L 29/04* (2013.01); *H01L 29/4966* (2013.01); *H01L 29/513* (2013.01); *H01L 29/516* (2013.01); *H01L 29/517* (2013.01); *H01L 29/6675* (2013.01); *H01L 29/6684* (2013.01); *H01L 29/78391* (2014.09); *H01L 29/78642* (2013.01); *H01L 21/02181* (2013.01); *H01L 21/02189* (2013.01);
(Continued)

(58) Field of Classification Search
CPC ............................ G11C 11/1675; G11C 11/22
USPC .................................................. 365/145, 158
See application file for complete search history.

(56) References Cited

U.S. PATENT DOCUMENTS 5,400,275 A * 3/1995 Abe ........................ G11C 11/22
257/E27.104
6,380,574 B1 * 4/2002 Torii .................... H01L 21/7687
257/295
(Continued)

Primary Examiner — Michael T Tran
(74) Attorney, Agent, or Firm — WPAT, PC

(57) ABSTRACT

A vertical ferroelectric thin film storage transistor and a data write and read method thereof are disclosed. The vertical ferroelectric thin film storage transistor includes a substrate having a first surface, a first conductive structure, a first insulating layer, a second conductive structure, and a second insulating layer sequentially disposed above a first surface of a substrate, and a vertical hole penetrates through the layers in a direction substantially perpendicular to the first surface of the substrate. A channel layer is disposed on a wall surface of the vertical hole and in electrical contact with the first conductive structure and the second conductive structure. An inner dielectric layer is disposed on one side of the channel layer. A ferroelectric layer is disposed on one side of the inner dielectric layer. A gate structure is disposed on one side of the ferroelectric layer. A third conductive structure is disposed above the second insulating layer or in the substrate, and in electrical contact with the third conducting structure and the gate structure.

11 Claims, 15 Drawing Sheets

(51) Int. Cl.
*H01L 29/78* (2006.01)
*H01L 29/04* (2006.01)
*H01L 29/49* (2006.01)
*G11C 11/22* (2006.01)
*H01L 27/11597* (2017.01)
*H01L 29/66* (2006.01)
*H01L 29/786* (2006.01)
*H01L 21/02* (2006.01)
*H01L 21/266* (2006.01)
*H01L 21/265* (2006.01)
*H01L 21/28* (2006.01)

(52) U.S. Cl.
CPC ...... *H01L 21/02194* (2013.01); *H01L 21/266* (2013.01); *H01L 21/26513* (2013.01); *H01L 21/28088* (2013.01); *H01L 21/28291* (2013.01)

(56) References Cited

U.S. PATENT DOCUMENTS

| | | | | |
|---|---|---|---|---|
| 6,483,492 | B1* | 11/2002 | Takeuchi | G02B 26/02 345/63 |
| 2002/0096701 | A1* | 7/2002 | Torii | H01L 21/76885 257/296 |
| 2006/0214206 | A1* | 9/2006 | Shuto | H01L 27/115 257/295 |
| 2006/0244031 | A1* | 11/2006 | Ichimori | H01L 21/76895 257/306 |
| 2008/0197390 | A1* | 8/2008 | Yamada | H01L 27/11502 257/295 |
| 2016/0118404 | A1* | 4/2016 | Peng | H01L 27/11597 257/295 |
| 2016/0181259 | A1* | 6/2016 | Van Houdt | H01L 27/1159 365/145 |

* cited by examiner

VERTICAL FERROELECTRIC THIN FILM STORAGE TRANSISTOR AND DATA WRITE AND READ METHODS THEREOF

FIELD OF THE INVENTION

The present disclosure relates to a ferroelectric thin film storage transistor, and data write and read methods applicable to the ferroelectric thin film storage transistor. More particularly, the disclosure relates to a vertical ferroelectric thin film storage transistor, and data write and read methods applicable to the vertical ferroelectric thin film storage transistor.

BACKGROUND OF THE INVENTION

A ferroelectric thin film storage transistor is a non-volatile memory under development. A schematic diagram illustrating a structure of a conventional ferroelectric thin film storage transistor is shown in FIG. 1. The ferroelectric thin film storage transistor includes a gate 12, a ferroelectric layer 14, a source 16 and a drain 18. Under certain voltage conditions, a semiconductor channel 19 is formed between the source 16 and the drain 18. In addition, in order to prevent electric charges in the semiconductor channel 19 from diffusing into the ferroelectric layer 14, it is also generally possible to dispose a dielectric layer 15 between the ferroelectric layer 14 and the semiconductor channel 19.

By controlling the voltages applied to the gate 12, the source 16, and the drain 18, a predetermined direction of polarization can be rendered on the ferroelectric layer 14, thereby writing data "1" or "0". As can be clearly seen from FIG. 1, since the channel through which an electric current flows is parallel to the surface of the substrate, the contact surface between the source 16 and the first conductive structure 111 as well as the contact surface between the drain 18 and the second conductive structure 112 are also parallel to the surface of the substrate 10. In order to lower circuit resistance, usually the contact surfaces, the gate 12 and the ferroelectric layer 14 must maintain a sufficient area, thus occupying a lot of chip area. As a result, the use of such horizontal ferroelectric thin film storage transistors makes it difficult to form sufficient memory cells in a limited area of the chip. Therefore, it is one of the objectives in this disclosure to improve drawbacks of conventional techniques.

SUMMARY OF THE INVENTION

In response to above requirements, this disclosure provides a vertical ferroelectric thin film storage transistor and a manufacturing method thereof. Besides, the disclosure also discloses a data write method and a data read method which are applicable to the vertical ferroelectric thin film storage transistor.

In an aspect of the present disclosure, a vertical ferroelectric thin film storage transistor comprises a substrate having a first surface; a first conductive structure disposed above the first surface of the substrate; a first insulating layer disposed above the first conductive structure; a second conductive structure disposed above the first insulating layer; a second insulating layer disposed above the second conductive structure; a vertical hole penetrating through the second insulating layer, the second conductive structure, the first insulating layer, the first conductive structure and the substrate in a direction substantially perpendicular to the first surface; a channel layer disposed on a wall surface of the vertical hole and being in electrical contact with the first conductive structure and the second conductive structure; an inner dielectric layer disposed on one side of the channel layer in the vertical hole; a ferroelectric layer disposed on one side of the inner dielectric layer in the vertical hole; a gate structure disposed on one side of the ferroelectric layer in the vertical hole; and a third conductive structure disposed above the second insulating layer or in the substrate, and being in electrical contact with the gate structure.

In an embodiment, the substrate is a semiconductor substrate formed with a selection transistor, wherein a gate of the selection transistor is electrically connected to a word line, a drain of the selection transistor is electrically connected to a bit line, and a source of the selection transistor is in electrical contact with the third conductive structure in the substrate.

Another aspect of the present disclosure provides a data write method, adapted for the above vertical ferroelectric thin film storage transistor with the selection transistor. A first electric potential is applied to both the first conductive structure and the second conductive structure. A first conducting potential is applied to the word line electrically connected to the gate of the selection transistor. A second electric potential is applied to the bit line electrically connected to the drain of the selection transistor, wherein the second electric potential is greater than the first electric potential to have a first data written into the vertical ferroelectric thin film storage transistor.

A further aspect of the present disclosure provides a data read method, adapted for the above vertical ferroelectric thin film storage transistor with the selection transistor. A zero potential is applied to the first conductive structure. A first conducting potential is applied to the word line electrically connected to the gate of the selection transistor. A second conducting potential is applied to the bit line electrically connected to the drain of the selection transistor to have the data stored in the vertical ferroelectric thin film storage transistor read out from the second conductive structure.

BRIEF DESCRIPTION OF THE DRAWINGS

The disclosure will become more readily apparent to those ordinarily skilled in the art after reviewing the following detailed description and accompanying drawings, in which.

DETAILED DESCRIPTION OF PREFERRED EMBODIMENTS

The disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
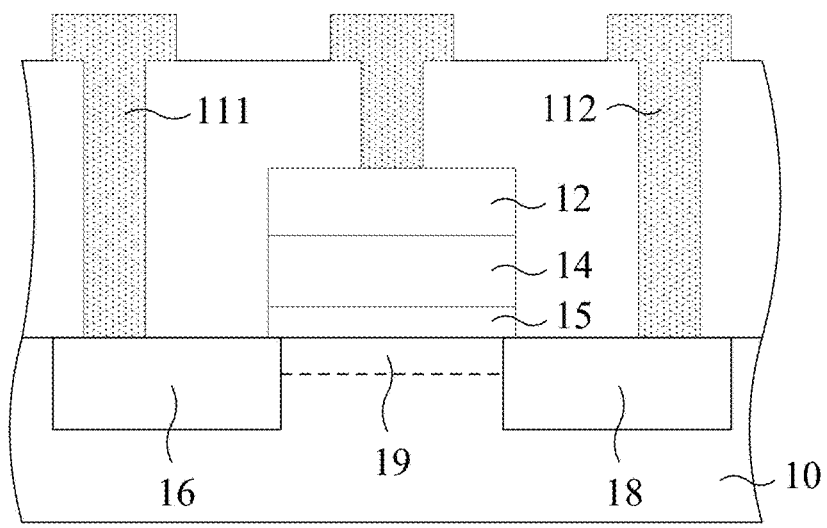
FIG. 1 is a schematic cross-sectional view of a conventional ferroelectric thin film storage transistor.
Figure 2A:
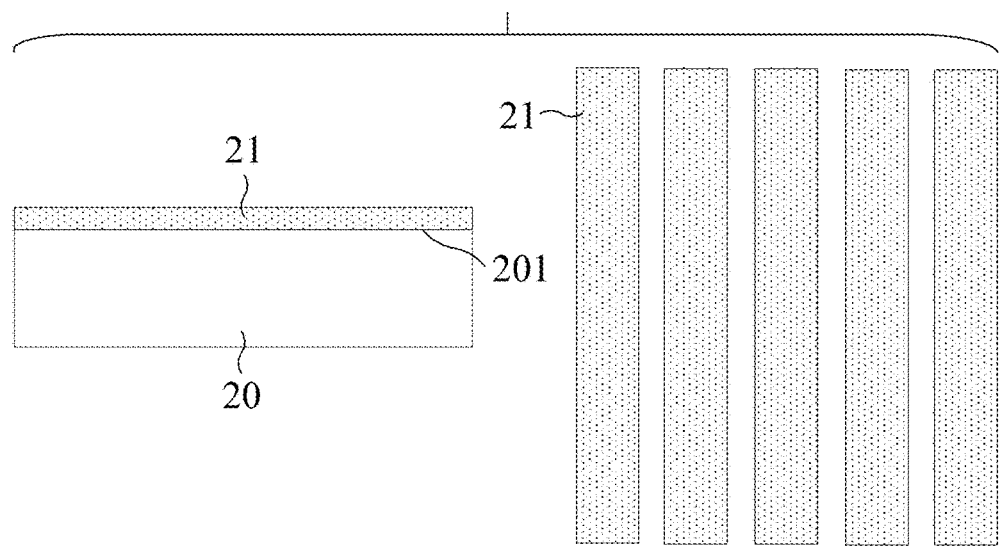
FIG. 2A to FIG. 2H are schematic diagrams illustrating the process steps of a vertical ferroelectric thin film storage transistor according to an embodiment of the present disclosure.

Please refer to FIGS. 2A to 2H. FIG. 2A to FIG. 2H are schematic diagrams illustrating the flow of the manufacturing processes of a vertical ferroelectric thin film storage transistor according to an embodiment of the present disclosure. The left side of each figure is a schematic diagram of a cross-sectional view, while the right side is a corresponding schematic diagram of a top view. The schematic diagram of the cross-sectional view is mainly for showing the structural relationship among elements, so the proportion and size of the structure in the figure are not completely the same as those of an actual object. As to the top view, some layers are omitted from the drawing for making the figure more clean and readable. FIG. 2A schematically shows a first conductive structure 21 formed and parallelly extending on a first surface 201 of a substrate 20 (commonly a semiconductor substrate, such as a silicon substrate). The first conductive structure 21 is mainly used to complete a source line.

Figure 2B:
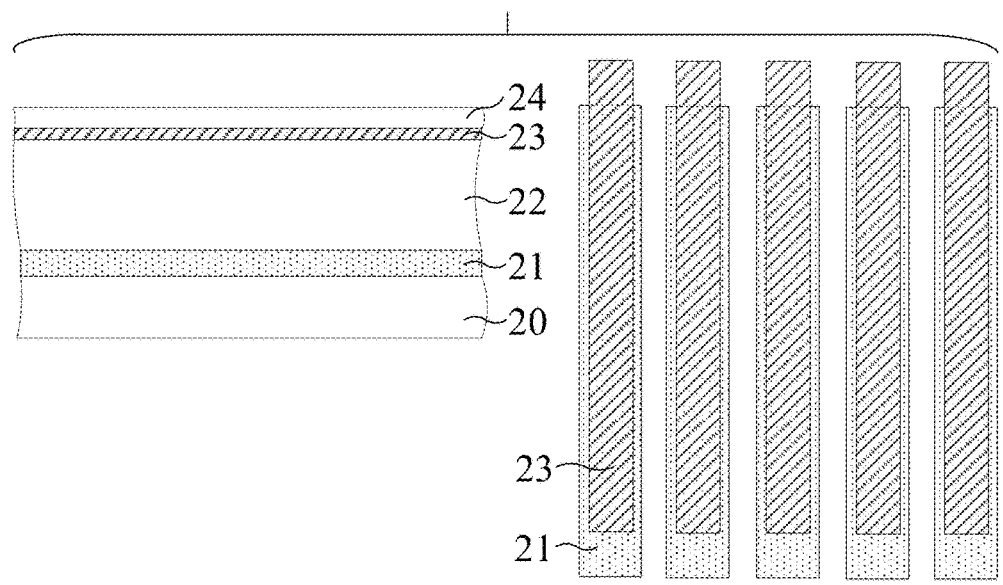

In FIG. 2B, a first insulating layer 22, a second conductive structure 23 and a second insulating layer 24 are sequentially formed above the first conductive structure 21. The material of the conductive structures may be, for example, doped polysilicon, aluminum or copper, and the material of the insulating layers may be, for example, silicon dioxide or silicon oxynitride.

Figure 2C:
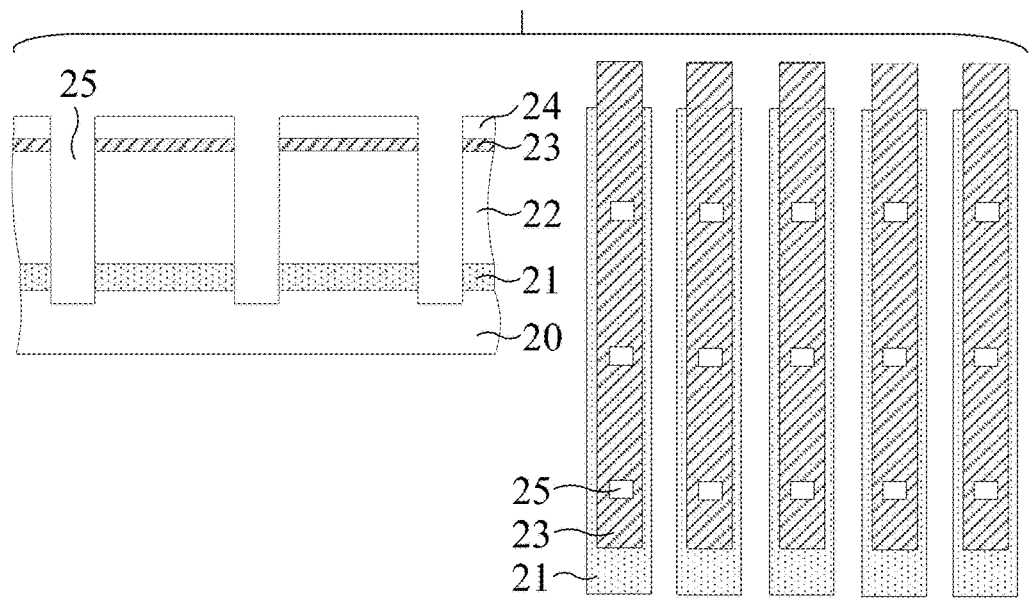

As shown in FIG. 2C, by lithography and etching, a vertical hole 25 is formed in a direction perpendicular to the first surface 201 and penetrates through the second insulating layer 24, the second conductive structure 23, the first insulating layer 22, the first conductive structure 21 and the substrate 20.

Figure 2D:
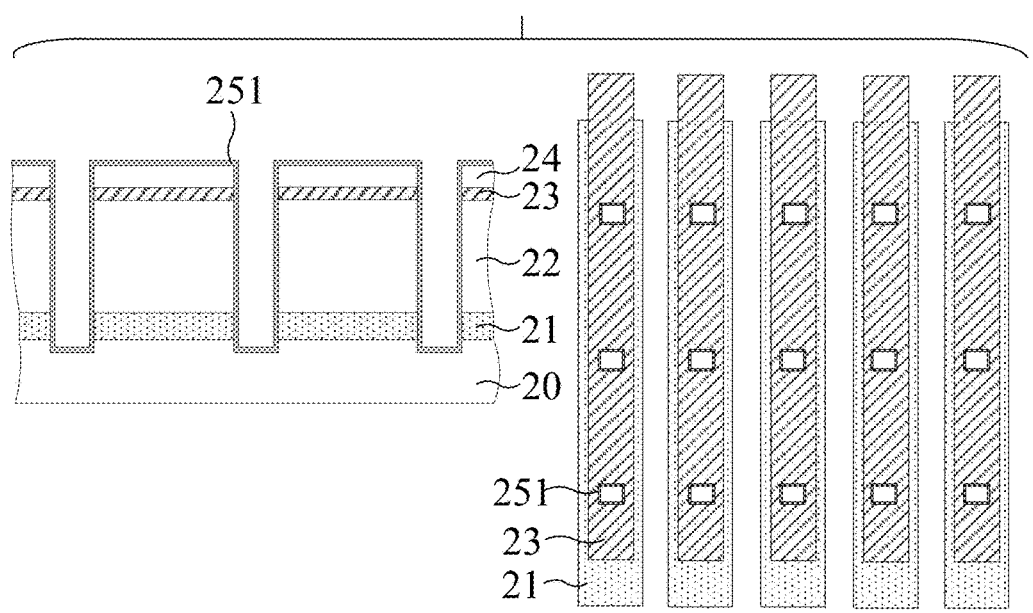
Figure 2E:
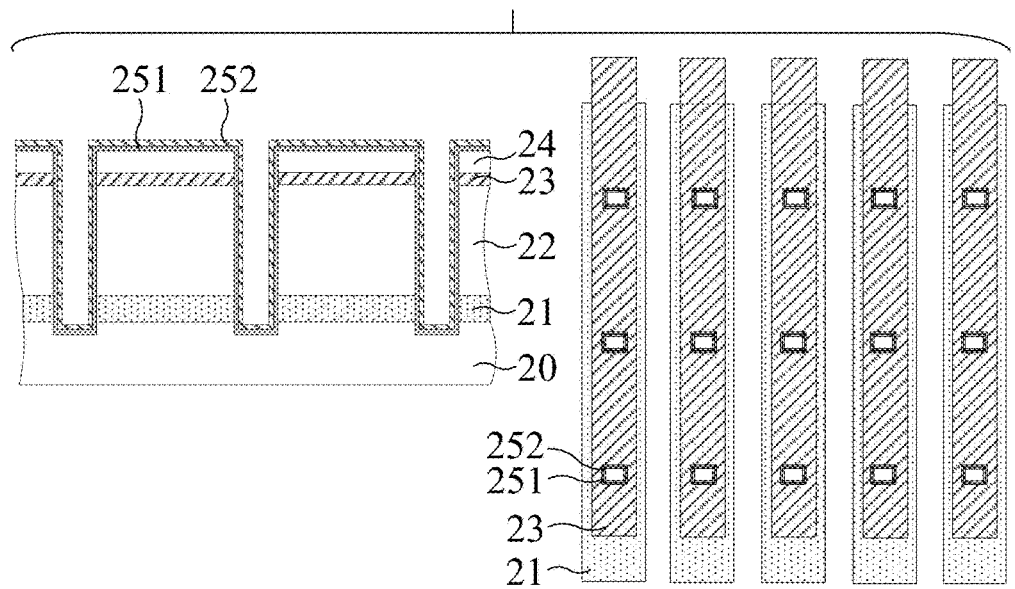
Figure 2F:
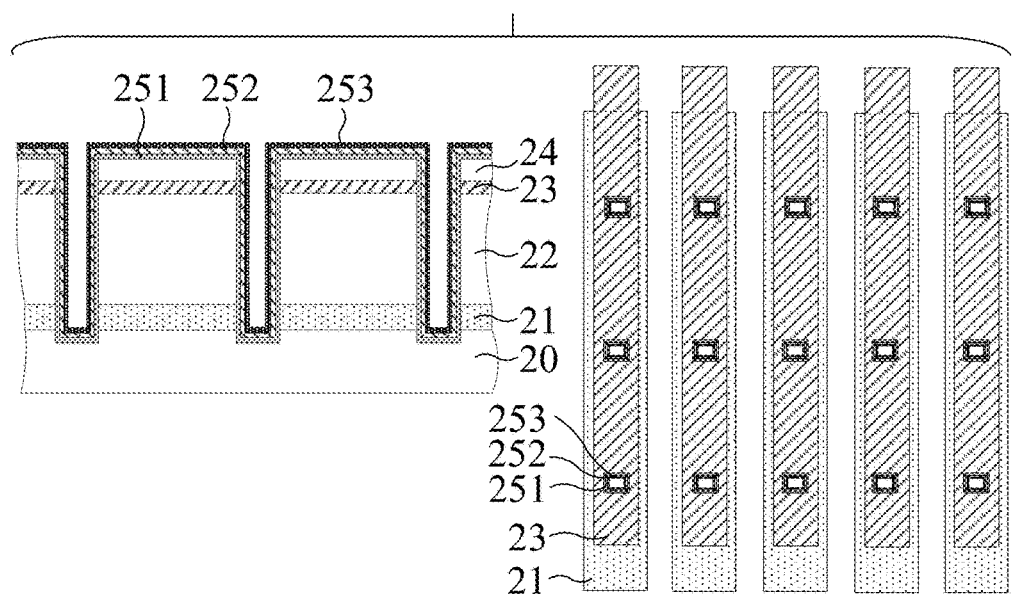

FIGS. 2D, 2E, and 2F respectively show technical means of depositing thin films, which include sequentially forming the channel layer 251, the inner dielectric layer 252 and the ferroelectric layer 253 in the vertical hole 25 as well as on the surface of the second insulating layer 24. The channel layer 251 is located on the wall surface of the vertical hole 25 and makes electrical contact with the first conductive structure 21 and the second conductive structure 23. While the material of the channel layer 251 may be doped N-type (or P-type) polysilicon, the material of the inner dielectric layer 252 may be a silicon oxide layer, silicon oxynitride, or other high dielectric constant material. The material of the ferroelectric layer 253 may be, for example, doped $HfO_2$ or doped HfZrOx, wherein the dopants includes one or a combination of the following elements: Si, Al, La, Y, Sr, Gd, Nb, Ni, and Ta. For details, reference may be made to other patents filed by the applicant earlier.

Figure 2G:
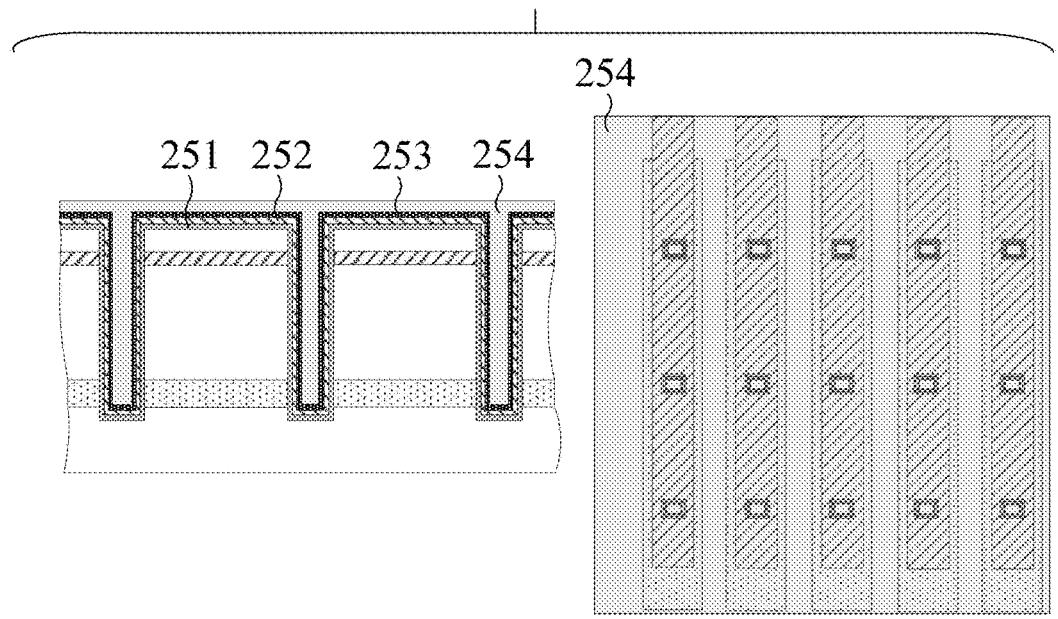
Figure 2H:
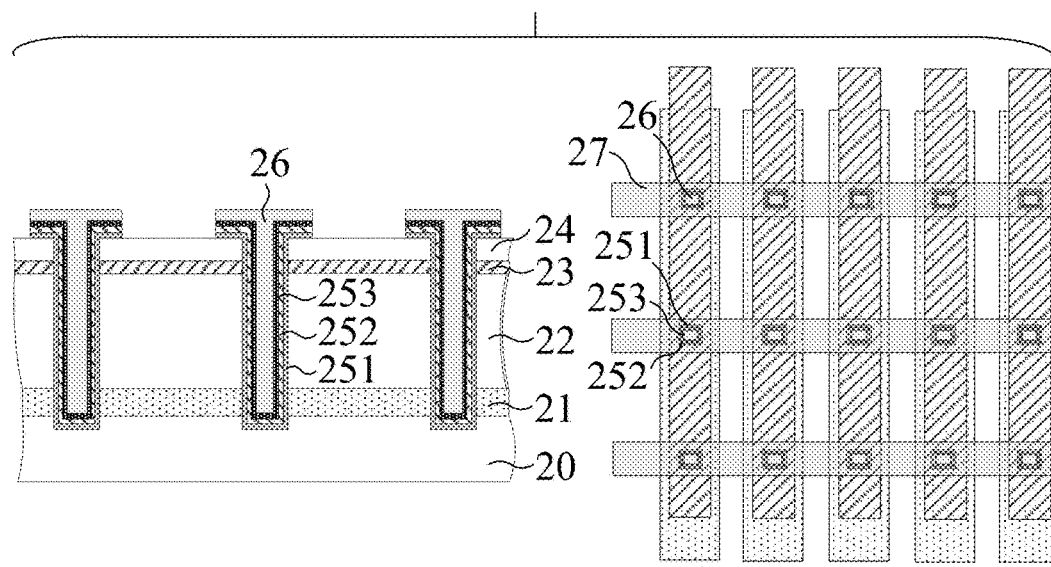

Referring to FIG. 2G, a gate structure layer 254 is further formed on one side and the surface of the ferroelectric layer 253 in the vertical hole 25. The gate structure layer 254 may be formed by depositing TiN and annealing. Then, by lithography and etching techniques, the gate structure layer 254 is patterned to define the gate structure 26 as shown in FIG. 2H. The third conductive structure 27 is formed over the second insulating layer 24, patterned as shown in the figure through etching, and electrically contacts the gate structure 26.

Thus, in the above embodiment of the present disclosure, a vertical ferroelectric thin film storage transistor as shown in FIG. 2H is completed. The substrate 20 has a first surface 201. The first conductive structure 21 is located on the first surface 201 of the substrate 20. The first insulating layer 22 is located above the first conductive structure 21. The second conductive structure 23 is located on the surface of the first insulating layer 22. The second insulating layer 24 is located above the second conductive structure 23. The vertical hole 25 penetrates through the second insulating layer 24, the second conductive structure 23, the first insulating layer 22, the first conductive structure 21, and the substrate 20 along a direction perpendicular to the first surface 201. The channel layer 251 is disposed on the wall surface of the vertical hole 25, and is in electrical contact with the first conductive structure 21 and the second conductive structure 23. The inner dielectric layer 252 is located on one side of the channel layer 251 in the vertical hole 25, and the ferroelectric layer 253 is located on one side of the inner dielectric layer 252 in the vertical hole 25. The gate structure 26 is located on one side of the ferroelectric layer 253 in the vertical hole 25. The third conductive structure 27 is located above the second insulating layer 24 and electrically contacts the gate structure 26.

It can be clearly seen from the figure that since the direction of the channel through which the current flows is substantially perpendicular to the surface of the substrate. The contact surface between the channel layer 251 and the first conductive structure 21 as well as the contact surface between the channel layer 251 and the second conductive structure 23 are substantially perpendicular to the surface of the substrate 20, so the occupied area of the chip is relatively small. As a result, more memory cells can be built in the same area of the chip by using the vertical ferroelectric thin film storage transistor completed according to this embodiment, thereby improving drawbacks of the prior art. In the following, the operation method of the vertical ferroelectric thin film storage transistor is illustrated by taking an N-type transistor as an example.

Figure 3A:
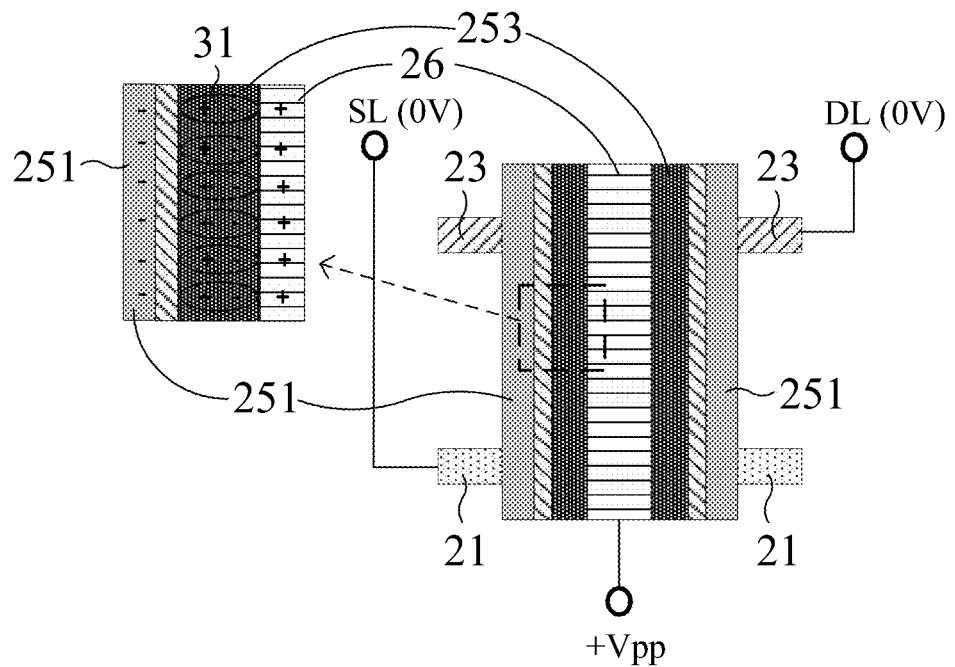
FIG. 3A to FIG. 3C are schemes illustrating the operations of a vertical ferroelectric thin film storage transistor according to an embodiment of the present disclosure.

Write data "1": a first electric potential is applied to both the first conductive structure 21 and the second conductive structure 23, and a second electric potential is applied to the gate structure 26, wherein the second electric potential is greater than the first electric potential. For example, the first electric potential is 0V and the second electric potential is Vpp (a common voltage value=2V to 15V, preferably 3V to 7V). In this way, the vertical ferroelectric film storage transistor will be written a first data "logic 1". As shown in FIG. 3A, both the electric potential of the first conductive structure 21 and the second conductive structure 23 are 0V and that of the channel layer 251 is also 0V. Therefore, when an electric potential Vpp is applied to the gate structure 26, the potential difference between the first electric potential and the second electric potential will induce dipoles 31 generated in the ferroelectric layer 253, which is disposed between the conductive structures and the gate structure, due to influence of an electric field. It is to be noted that FIG. 3A is a cross-sectional view, so the left and right portions of the ferroelectric layer 253 as shown are actually connected. As shown in the figure, the polarity directions of the dipoles 31 in the ferroelectric layer 253 under such voltage condition will appear as "the positive poles are near the gate, and the negative poles are near the channel layer" (see the enlarged upper left diagram). In this way, majority carriers in the channel layer 251 will be electrons, and that is, the vertical ferroelectric thin film storage transistor is written a first data "logic 1". As for the first conductive structures 21, the second conductive structures 23 and the third conductive structures 27 connected to the vertical ferroelectric thin film storage transistors not written data, a voltage of ½ Vpp can be provided to them for assuring stability of the originally stored data.

Figure 3B:
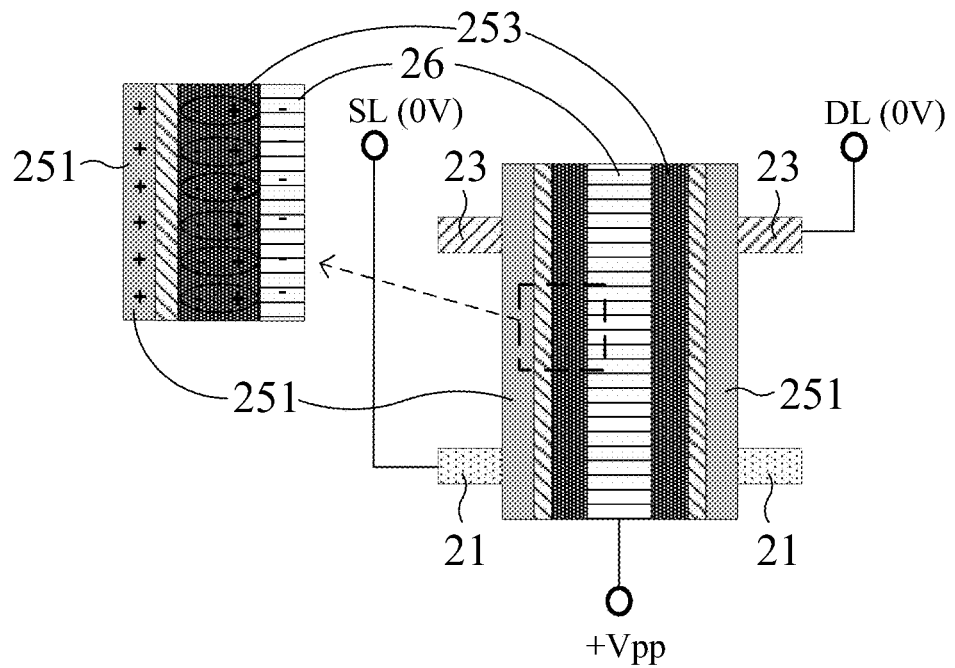

Write data "0": a third electric potential is applied to both the first conductive structure 21 and the second conductive structure 23, and a fourth electric potential is applied to the gate structure 26, wherein the third electric potential is greater than the fourth electric potential. For example, the third electric potential is Vpp (a common voltage value=−2V to −15V, preferably −3V to −7V), and the fourth electric potential is 0V. In this way, the vertical ferroelectric film storage transistor will be written a second data "logic 0". As shown in FIG. 3B, both the electric potential of the first conductive structure 21 and the electric potential of the second conductive structure 23 are Vpp (or 0V), and that of the channel layer 251 is also Vpp (or 0V). Therefore, when an electric potential 0V (or −Vpp) is applied to the gate structure 26, the potential difference between the third electric potential and the fourth electric potential will induce dipoles 32 generated in the ferroelectric layer 253, which is disposed between the conductive structures and the gate structure, due to influence of an electric field effect. As shown in the figure, the polarity directions of the dipoles 32 in the ferroelectric layer 253 under such voltage condition will appear as "the negative poles are near the gate and the positive poles are near the channel layer" (see the enlarged upper left diagram). In this way, majority carriers in the channel layer 251 will be holes, and that is, the vertical ferroelectric thin film storage transistor is written a second data "logic 0". As for the first conductive structures 21, the second conductive structures 23 and the third conductive structures 27 connected to the vertical ferroelectric thin film storage transistors not written data, a voltage of ½ Vpp (or −½ Vpp) can be provided to them for assuring stability of the originally stored data.

Figure 3C:
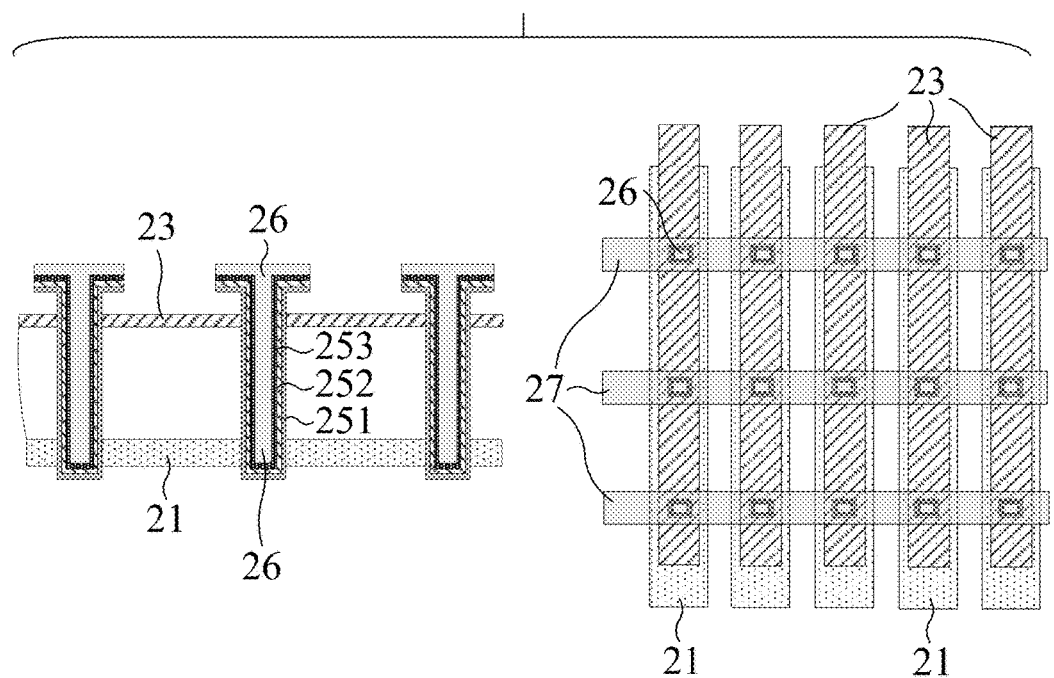

Data readout: As shown in FIG. 3C, a "zero" potential is applied to the first conductive structure 21, and a turn-on voltage Von is applied to the gate structure 26, so that the data stored in the vertical ferroelectric film storage transistor can be presented by the voltage read out from the second conductive structure 23. For example, when the "zero" potential is 0V, the turn-on voltage may be the voltage required to turn on the transistor (typically 1.2V to 3.3V for a common transistor specification). Thus, the data stored in the vertical ferroelectric thin film transistor can be read out through the second conductive structure 23. As for the first conductive structures 21 and the third conductive structures 27 connected to the vertical ferroelectric thin film storage transistors which are not to be read, a voltage 0V is applied to them.

Figure 4A:
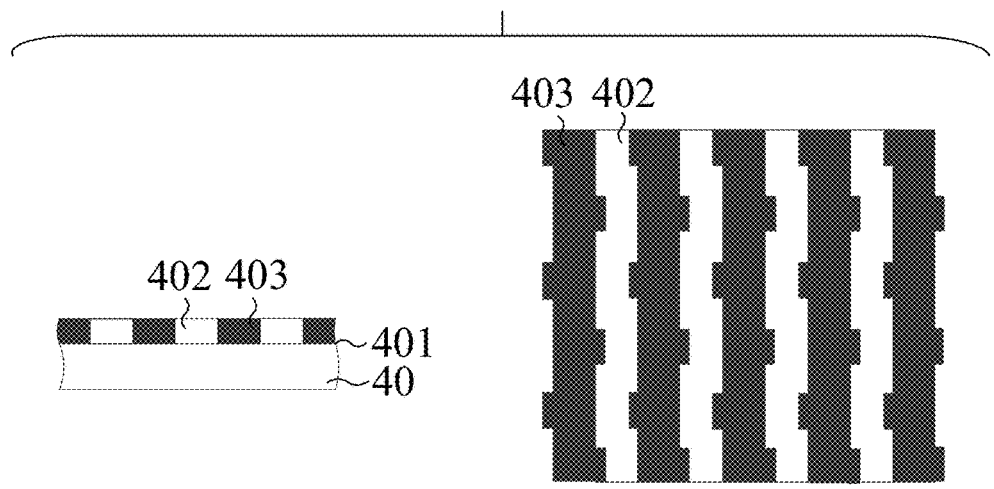
FIG. 4A to FIG. 4L are schematic diagrams illustrating the process steps of a vertical ferroelectric thin film storage transistor according to another embodiment of the present disclosure.
Figure 4B:
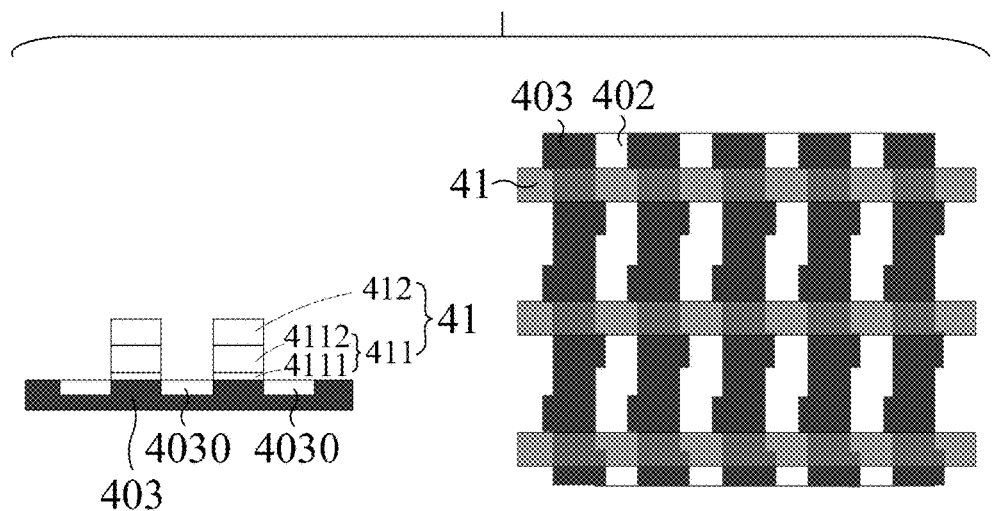

Refer to FIG. 4A to FIG. 4L, which are schematic diagrams of the manufacturing processes of a vertical ferroelectric thin film storage transistor according to another embodiment of the present disclosure. The left side as shown in each figure is a schematic diagram of a cross-sectional view, while the right side is a corresponding schematic diagram of a top view. FIG. 4A shows that an active region is formed on a first surface 401 of a substrate 40 (typically a semiconductor substrate, such as a silicon substrate). A shallow trench isolation (STI) process is used to form a silicon-dioxide shallow trench 402 and an active region 403. FIG. 4B shows fabrication of the word line structure 41 on a surface of the shallow trench 402 and the active region 403. The cross-sectional view as shown in FIG. 4B is drawn along the direction in which the active region 403 extends. The word line structure 41 is a multi-layer structure including a gate insulating layer 411 and a gate conductor layer 412. The gate insulating layer 411 may be formed of, for example, a silicon oxynitride layer 4111 and a high dielectric constant material layer (HK dielectric) 4112. The material of the gate conductor layer 412 may be, for example, titanium nitride. Also, by using the word line structure 41 as a mask, ion implantation of dopants, e.g. arsenic, can be conducted to form a heavily doped region 4030, for example, an N+region, in the active region 403 on both sides of the word line structure 41.

Figure 4C:
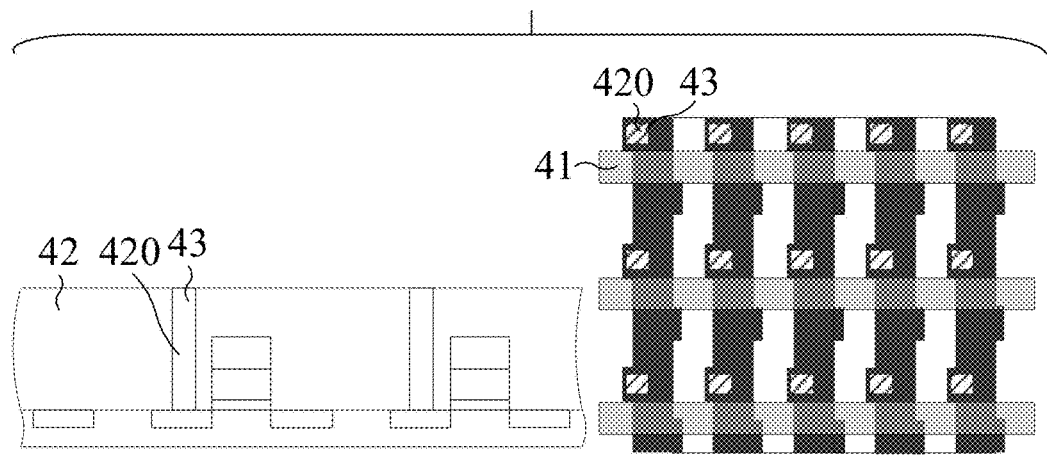
Figure 4D:
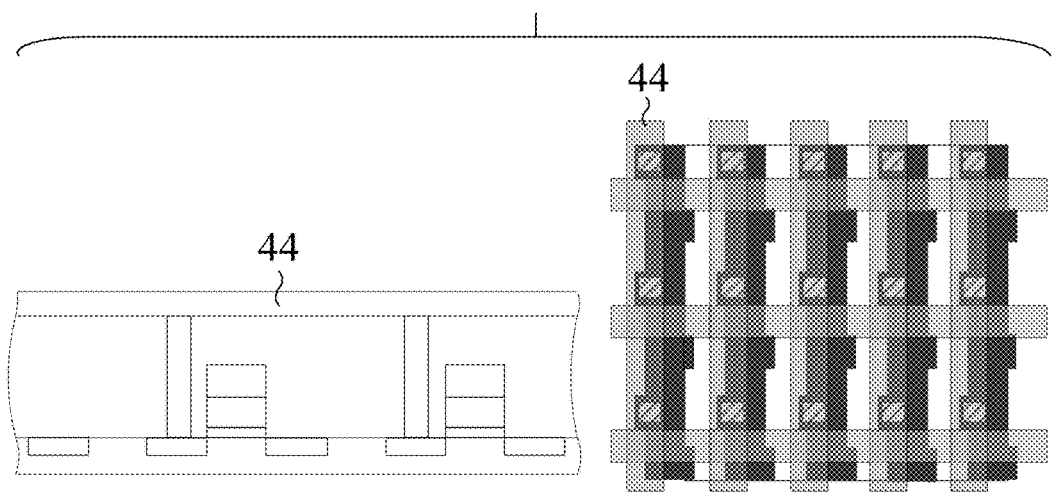

FIG. 4C shows that a fourth insulating layer 42 is formed above the word line structure 41 and the heavily doped region 4030. Then a first hole 420 is formed above a portion of the heavily doped region 4030 to expose the heavily doped region 4030, and the first hole 420 is filled with a bit-write contact structure 43. FIG. 4D shows that a bit-write conduction structure 44 is fabricated over the fourth insulating layer 42 to make electrical contact with the plurality of bit-write contact structures 43 on the same straight line.

Figure 4E:
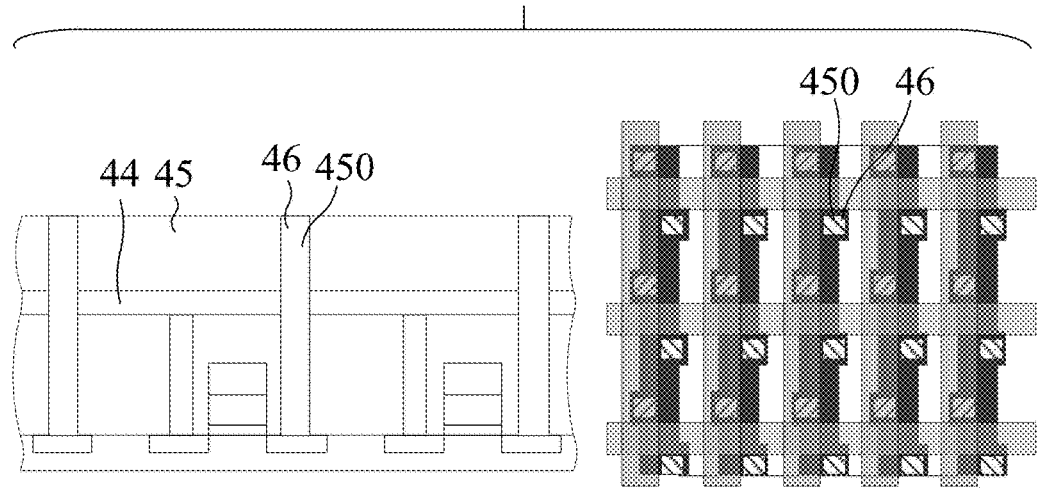
Figure 4F:
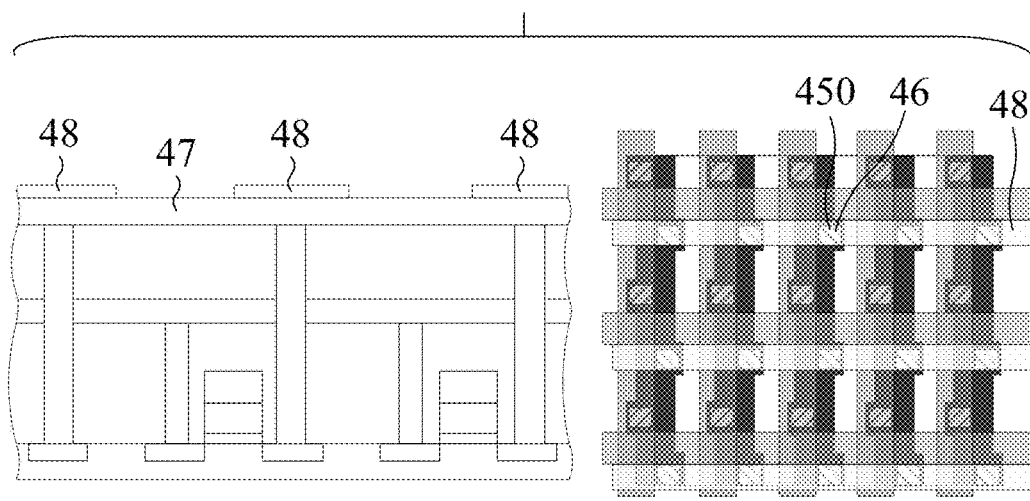

FIG. 4E shows that a fifth insulating layer 45 is formed over the bit writing conducting structure 44 and the fourth insulating layer 42, and then a second hole 450 is formed above a portion of the heavily doped region 4030 to expose the heavily doped region 4030. The second hole 450 is located at a position avoiding the bit-writing conduction structure 44, and a source contact structure 46 is filled in the second hole 450. FIG. 4F shows that a sixth insulating layer 47 is further formed above the fifth insulating layer 45 and the source contact structure 46, and a first conductive structure 48 is formed above the sixth insulating layer 47 as a plate conductive structure (plate line).

Figure 4G:
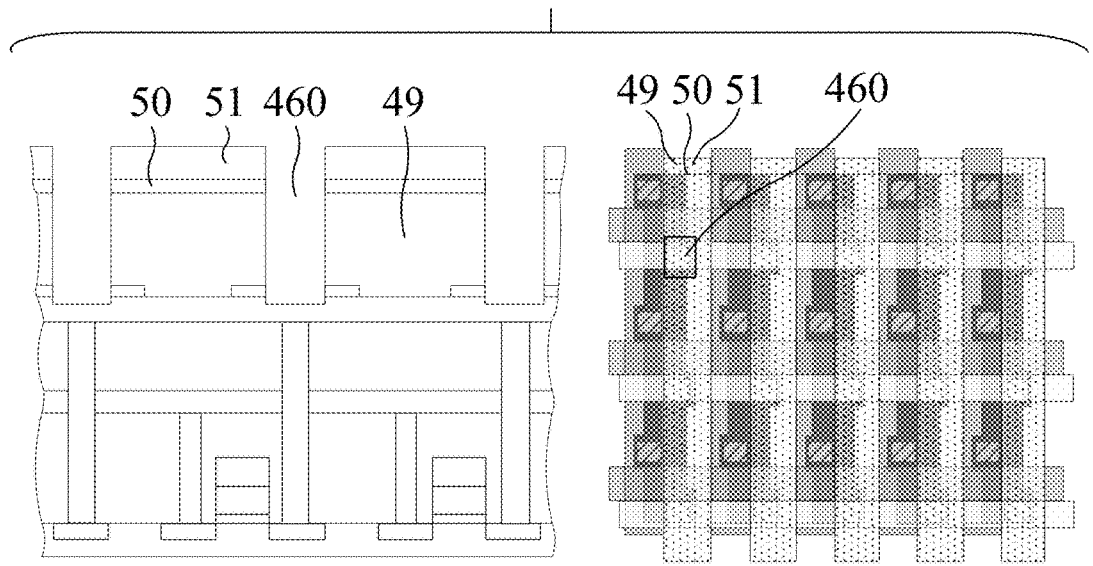

Referring to FIG. 4G, a seventh insulating layer 49, a second conductive structure 50 and an eighth insulating layer 51 are fabricated over the first conductive structure 48. The second conductive structure 50 is configured as a bit reading conducting structure. A vertical hole 460 is then formed over the source contact structure 46 while the bottom of the vertical hole 460 is still in the sixth insulating layer 47. The vertical hole 460 may be formed by using lithography and etching techniques so that the vertical hole 460 penetrates through the eighth insulating layer 51, the second conductive structure 50, the seventh insulating layer 49, the first conductive structure 48, and a portion of the sixth insulating layer 47, in a direction perpendicular to the substrate surface.

Figure 4H:
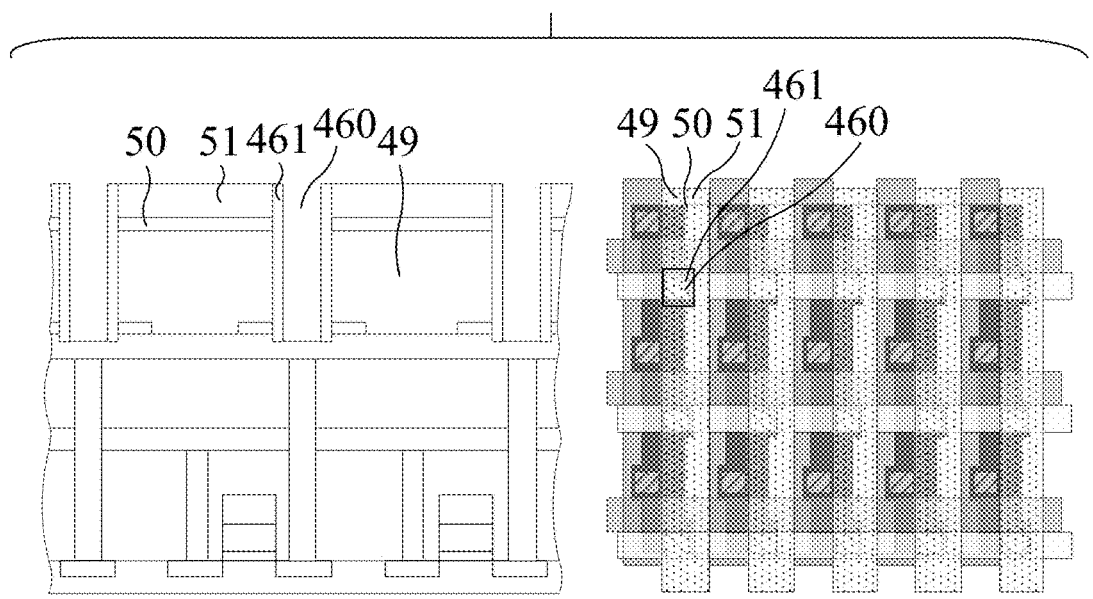
Figure 4I:
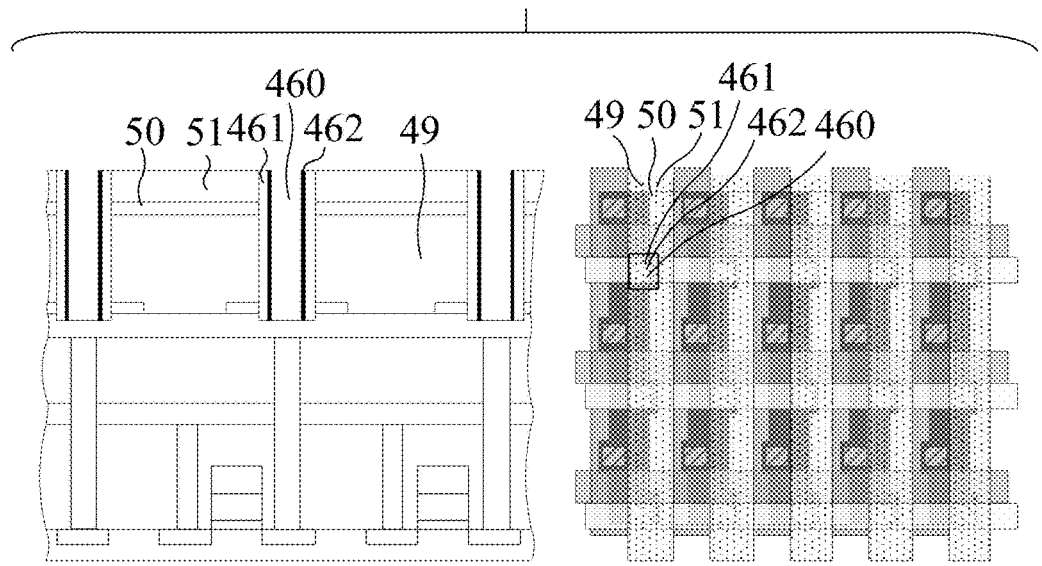
Figure 4J:
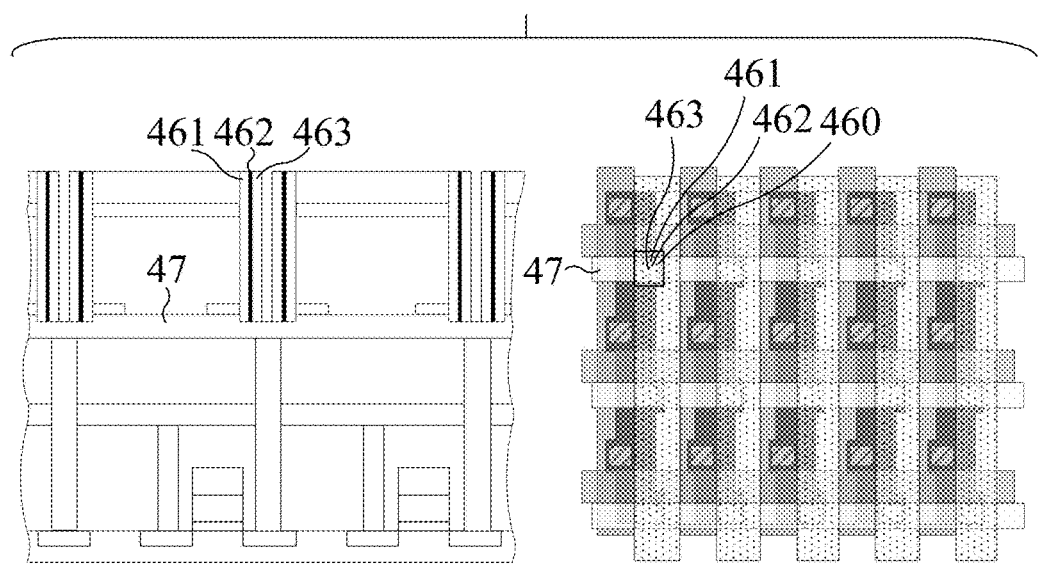

Refer to FIGS. 4H, 4I and 4J, a channel layer 461, an inner dielectric layer 462, and a ferroelectric layer 463 are sequentially formed on the wall surface of the vertical hole 460 by way of thin film deposition and etch-back processes. The etch-back process is performed to remove portions of the deposited thin film from the bottom of the vertical hole 460 and the surface of the eighth insulating layer 51. The channel layer 461 is located on the wall surface of the vertical hole 460 and makes electrical contact with the first conductive structure 48 and the second conductive structure 50. The material of the channel layer 461 may be, for example, doped N-type (or P-type) polysilicon. The material of the inner dielectric layer 462 may be, for example, a silicon oxide layer, silicon oxynitride, or other high dielectric constant material. The material of the ferroelectric layer 463 may be, for example, doped $HfO_2$ or doped $HfZrO_x$, wherein the dopants includes one or a combination of the following elements: Si, Al, La, Y, Sr, Gd, Nb, Ni, and Ta.

Figure 4K:
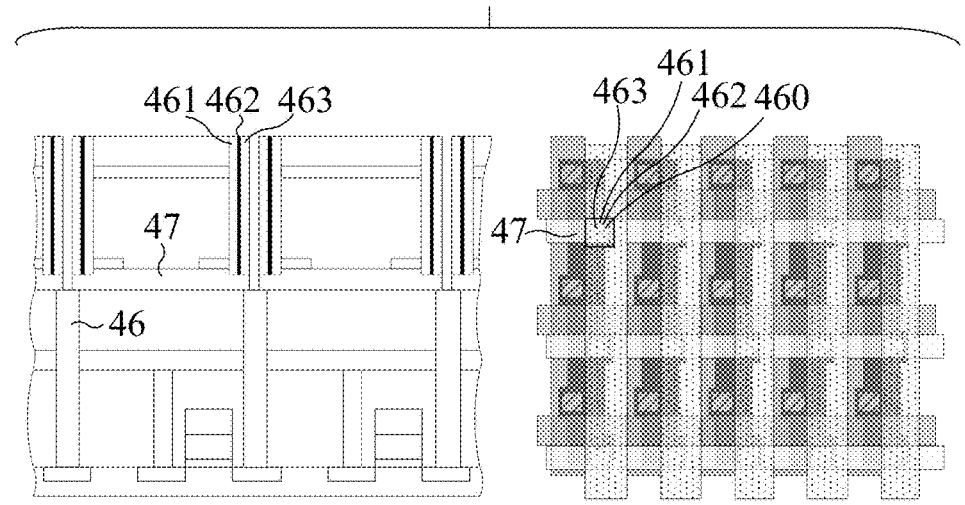

Referring to FIG. 4K, the sixth insulating layer 47 uncovered by the ferroelectric layers 463 in the vertical hole 460 is etched back until the underlying source contact structure 46 is exposed. Afterwards, referring to FIG. 4L, a thin film deposition is performed (e.g. titanium nitride is deposited and then annealed) to form a gate structure 464 is performed for filling the through hole within the ferroelectric layer 463 and making electrical contact with the underlying source contact structure 46. After the deposition is completed, a chemical mechanical polishing process can be performed to planarize the chip surface.

Figure 4L:
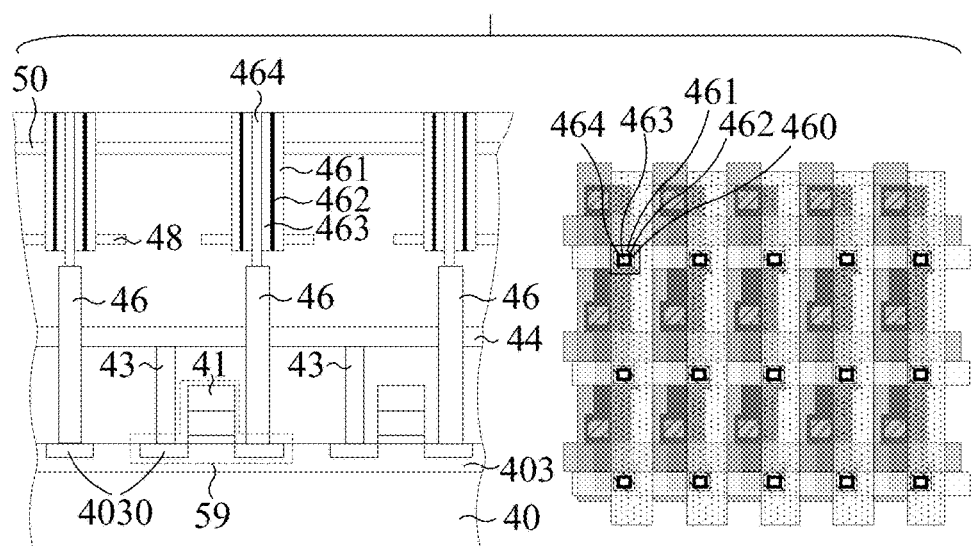

In this way, another vertical ferroelectric thin film storage transistor as shown in FIG. 4L is completed. The vertical ferroelectric thin film storage transistor is fabricated on the first surface 401 of the substrate 40 (typically a semiconductor substrate, such as a silicon substrate). The word line structure 41 consisting of the gate insulating layer 411 and the gate conductor layer 412 and the two heavily doped regions 4030 formed in the active regions 403 on both sides of the word line structure 41 together constitute a selection transistor 59. The two heavily doped regions 4030 function as the source and drain of the selection transistor 59. The bit-write conduction structure 44 is used to make electrical contact with the plurality of bit-write contact structures 43 on the same straight line, and the bit-write contact structure 43 is electrically connected to the drain implemented with the heavily doped region 4030. The source contact structure 46 makes electrical contact with the source implemented with the heavily doped region 4030. The vertical hole 460 penetrates through the eighth insulating layer 51, the second conductive wire structure 50, the seventh insulating layer 49, the first conductive structure 48 and the sixth insulating layer 47 in a direction perpendicular to the first surface 401. The channel layer 461 is located on the wall surface of the vertical hole 460 and is in electrical contact with the first conductive structure 48 and the second conductive structure 50. The inner dielectric layer 462 is located on one side of the channel layer 461 in the vertical hole 460, and the ferroelectric layer 463 is located on one side of the inner dielectric layer 462 in the vertical hole 460. The gate structure 464 is filled into the through hole within the ferroelectric layer 463 in the vertical hole 460 to make electrical contact with the underlying source contact structure 46.

As can be clearly seen from the above figures, since the direction of the channel through which the current flows is substantially perpendicular to the surface of the substrate, the vertical ferroelectric film storage transistor of the present disclosure occupies a relatively small chip area. In addition, the selection transistor 59 and the corresponding vertical ferroelectric thin film storage transistor are disposed in a stacked configuration, which further efficiently saves chip area. In other words, more memory cells can be fabricated within a chip having the same area so as to improve drawbacks of the current available techniques. Though the selection transistor shown in the figures is a horizontal transistor, the selection transistor of course may also adopt other type of transistor occupying smaller area, such as a vertical transistor, in order to further reducing area. The details are not described herein again. The operation method of the circuit components is described as follows.

Write data "1": a first electric potential is applied to both the first conductive structure 48 and the second conductive structure 50, and a second electric potential is applied to the gate structure 464, wherein the second electric potential is greater than the first electric potential. For example, the first electric potential is 0V and the second electric potential is Vpp (a common voltage value=2V to 15V, preferably 3V to 7V). In this way, the vertical ferroelectric thin film storage transistor will be written a first data "logic 1". In order for making the second electric potential Vpp applied to the gate structure 464, a turn-on voltage Von is applied to the word line structure 41 of the corresponding selection transistor 59, and the second electric potential Vpp is then applied to the bit-write conduction structure 44. As for the word line structures 41 connected to the vertical ferroelectric thin film storage transistors not written data, a voltage of 0V can be applied for turning off the selection transistors 59 so as to assure stability of the originally stored data.

Write data "0": a third electric potential is applied to both the first conductive structure 48 and the second conductive structure 50, and a fourth electric potential is applied to the gate structure 464, wherein the third electric potential is greater than the fourth electric potential. For example, the third electric potential is 0V and the fourth electric potential is −Vpp (a common voltage value=2V to 15V, preferably 3V to 7V). In this way, the vertical ferroelectric thin film storage transistor will be written a first data "logic 0". In order for making the fourth electric potential −Vpp applied to the gate structure 464, a turn-on voltage Von is applied to the word line structure 41 of the corresponding selection transistor 59, and the fourth electric potential −Vpp is then applied to the bit-write conduction structure 44. As for the word line structures 41 connected to the vertical ferroelectric thin film storage transistors not written data, a voltage of 0V can be applied for turning off the selection transistors 59 so as to assure stability of the originally stored data.

Figure 5A:
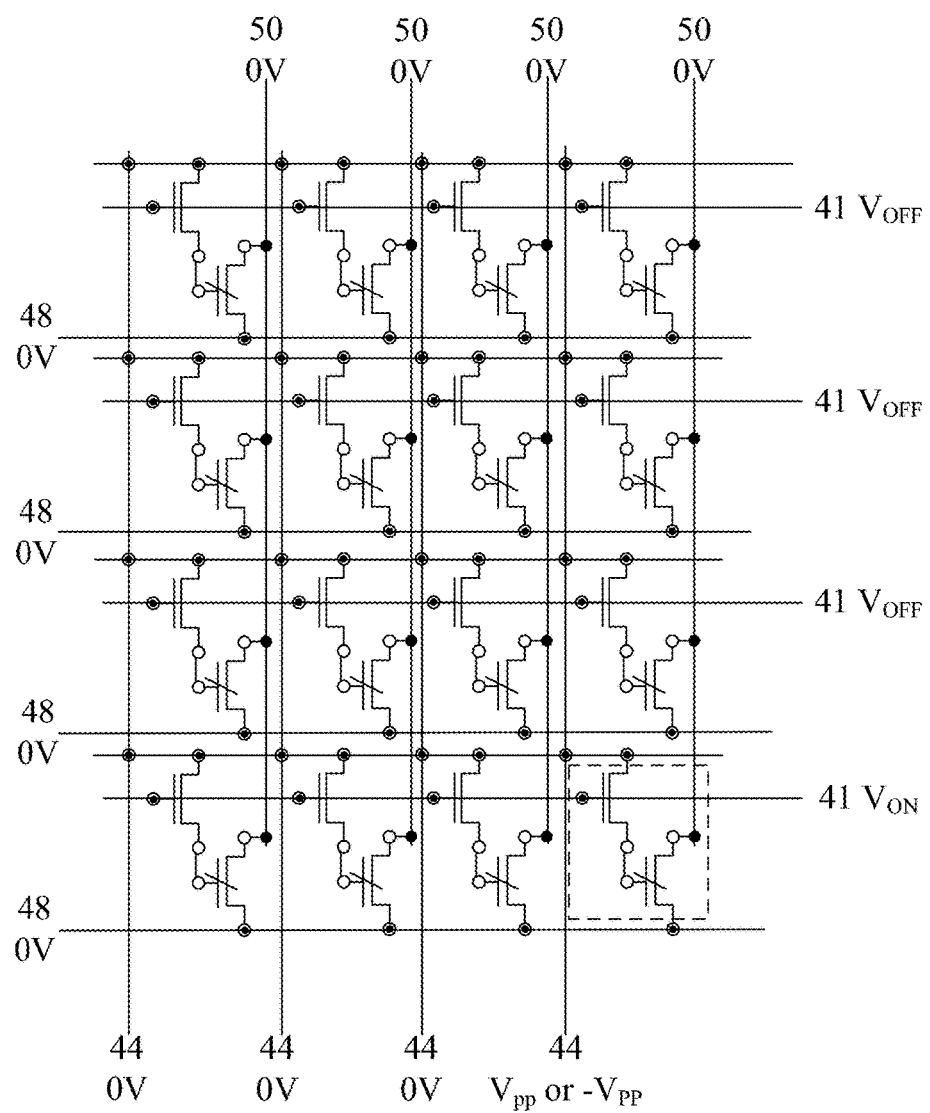
FIG. 5A and FIG. 5B are schemes illustrating the operations of a vertical ferroelectric thin film storage transistor according to another embodiment of the present disclosure.

The principle of the aforementioned data writing operations is the same as that with reference to FIGS. 3A and 3B, and thus is not described again herein. The settings of the voltage input/output terminals can be understood with reference to the schematic circuit diagram shown in FIG. 5A. As shown in the figure, for writing data "1", a first voltage of 0 V is applied to both the first conductive structure 48 and the second conductive structure 50, and a turn-on voltage Von is applied to the word line structure 41 of the corresponding selection transistor 59. Meanwhile, the second electric potential Vpp is applied to the corresponding bit-write conduction structure 44. A voltage 0V may be applied to the word line structures 41 connected to the vertical ferroelectric thin film storage transistors not written data, for turning off the selection transistors 59 to ensure that the originally stored data are stable. For writing data "0", the third electric potential 0V is applied to the first conductive structure 48 and the second conductive structure 50, and the turn-on voltage Von is applied to the word line structure 41 of the corresponding selection transistor 59. Meanwhile, the fourth potential −Vpp is applied to the corresponding bit-write conduction structure 44. As for the word line structures 41 connected to the vertical ferroelectric thin film transistors not written data, a turn-off voltage Voff can be provided to turn off the select transistors 59 to ensure the originally stored data are stable.

Figure 5B:
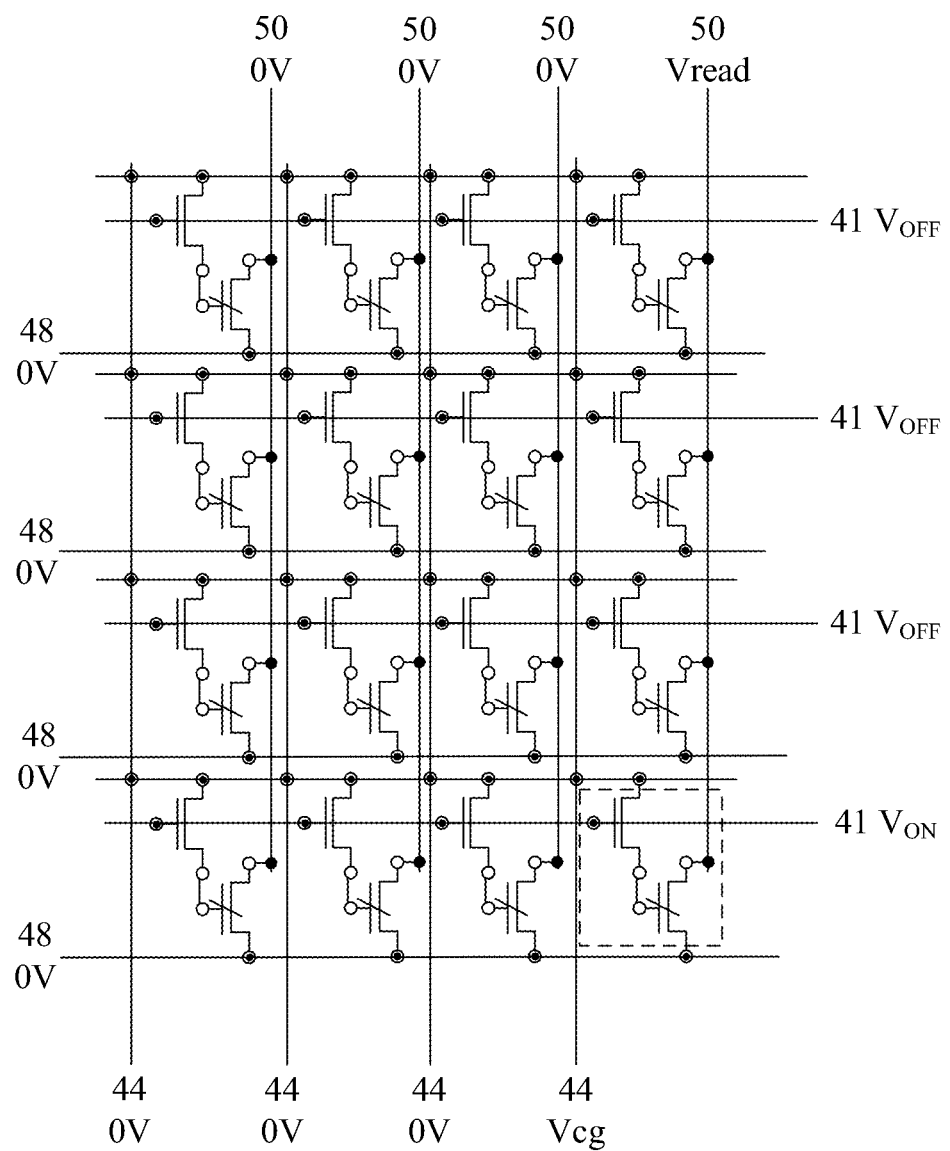

The voltage input and output settings for reading data can be understood with reference to the circuit diagram of FIG. 5B. A "zero" potential is applied to the first conductive structure 48, a turn-on voltage Von is applied to the word line structure 41 of the corresponding selection transistor 59. Meanwhile, a conducting potential Vcg is applied to the corresponding bit-write conduction structure 44 so that the data stored in the vertical ferroelectric thin film storage transistor can be presented by the voltage Vread read out from the second conductive structure 50. Furthermore, a voltage 0V is applied to the first conductive structures 48 connected to the vertical ferroelectric film storage transistors not read, and a turn-off voltage Voff is applied to the word line structures 41 to ensure that other vertical ferroelectric thin film storage transistors is unaffected.

In an example, the turn-on voltage Von has a value ranging from 1.2V to 3.3V, the conducting potential Vcg has a value ranging from 0.1V to 0.8V, and the turn-off voltage Voff has a value of 0V. The structure of the vertical ferroelectric thin film storage transistor can be applied to manufacturing of embedded memories in a wafer foundry where standard foundry processes are run at the front end of the production line, and fabrication of the vertical ferroelectric thin film storage transistor may be implemented at the back end of the production line.

To sum up, the embodiments of the present disclosure provide a novel structure of a ferroelectric thin film storage transistor, a manufacturing method of the ferroelectric thin film storage transistor and memory cells fabricated by the method. Especially, the embodiments of the present disclosure provide a novel structure, a method, and memory cells of a vertical ferroelectric thin film storage transistor. It can be clearly seen from the above figures that the direction of the channel through which the current flows is substantially perpendicular to the surface of the substrate, so the area occupied by the vertical ferroelectric thin film storage transistor is relatively small. Furthermore, stacking of the corresponding vertical ferroelectric thin film storage transistor on the selection transistor 59 effectively saves area, so that more memory cells can be accommodated in a chip having the same area. The selection transistor shown in the figures is a horizontal transistor. The selection transistor of course may also adopt other type of transistor occupying smaller area, such as a vertical transistor, in order to further reducing area.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A vertical ferroelectric thin film storage transistor, comprising:
   a substrate having a first surface;
   a first conductive structure disposed above the first surface of the substrate;
   a first insulating layer disposed above the first conductive structure;
   a second conductive structure disposed above the first insulating layer;
   a second insulating layer disposed above the second conductive structure;
   a vertical hole penetrating through the second insulating layer, the second conductive structure, the first insulating layer, the first conductive structure and the substrate in a direction substantially perpendicular to the first surface;
   a channel layer disposed on a wall surface of the vertical hole and being in electrical contact with the first conductive structure and the second conductive structure;
   an inner dielectric layer disposed on one side of the channel layer in the vertical hole;
   a ferroelectric layer disposed on one side of the inner dielectric layer in the vertical hole;
   a gate structure disposed on one side of the ferroelectric layer in the vertical hole; and
   a third conductive structure disposed above the second insulating layer or in the substrate, and being in electrical contact with the gate structure.

2. The vertical ferroelectric thin film storage transistor according to claim 1, wherein the substrate is a semiconductor substrate, the first, second and third conductive structures are metal line structures, the first and second insulating layers are silicon dioxide layers, the channel layer is a polysilicon layer, the inner dielectric layer is a silicon dioxide or silicon oxynitride layer, the ferroelectric layer is a doped $HfO_2$ or doped HfZrOx layer with dopants selected from a group consisting of elements Si, Al, La, Y, Sr, Gd, Nb, Ni, Ta and a combination thereof, and the gate structure is a TiN layer.

3. The vertical ferroelectric thin film storage transistor according to claim 1, wherein the substrate is a semiconductor substrate in which a selection transistor is disposed, wherein a gate of the selection transistor is electrically connected to a word line, a drain of the selection transistor is electrically connected to a bit line, and a source of the selection transistor is in electrical contact with the third conductive structure in the substrate.

4. The vertical ferroelectric thin film storage transistor according to claim 3, wherein the selection transistor is a vertical transistor.

5. The vertical ferroelectric thin film storage transistor according to claim 3, wherein the selection transistor is a horizontal transistor.

6. The vertical ferroelectric thin film storage transistor according to claim 1, wherein a first electric potential is applied to both the first conductive structure and the second conductive structure, and a second electric potential is applied to the gate structure, wherein the second electric potential is greater than the first electric potential to have a first data written into the vertical ferroelectric thin film storage transistor.

7. The vertical ferroelectric thin film storage transistor according to claim 6, wherein a third electric potential is applied to both the first conductive structure and the second conductive structure, and a fourth electric potential is applied to the gate structure, wherein the third electric potential is greater than the fourth electric potential to have a second data written into the vertical ferroelectric thin film storage transistor.

8. The vertical ferroelectric thin film storage transistor according to claim 1, wherein a zero potential is applied to the first conductive structure, a conducting potential is applied to the gate structure to have the data stored in the vertical ferroelectric thin film storage transistor read out from the second conductive structure.

9. A data write method, adapted for the vertical ferroelectric thin film storage transistor according to claim 3, comprising:
   applying a first electric potential to both the first conductive structure and the second conductive structure;
   applying a first conducting potential to the word line electrically connected to the gate of the selection transistor; and
   applying a second electric potential to the bit line electrically connected to the drain of the selection transistor, wherein the second electric potential is greater than the first electric potential to have a first data written into the vertical ferroelectric thin film storage transistor.

10. The data write method according to claim 9, further comprising:
    applying a third electric potential to both the first conductive structure and the second conductive structure;
    applying a second conducting potential to the word line electrically connected to the gate of the selection transistor; and
    applying a fourth electric potential to the bit line electrically connected to the drain of the selection transistor, wherein the third electric potential is greater than the fourth electric potential to have a second data written into the vertical ferroelectric thin film storage transistor.

11. A data read method, adapted for the vertical ferroelectric thin film storage transistor according to claim 3, comprising:

applying a zero potential to the first conductive structure;

applying a first conducting potential to the word line electrically connected to the gate of the selection transistor; and applying a second conducting potential to the bit line electrically connected to the drain of the selection transistor to have the data stored in the vertical ferroelectric thin film storage transistor read out from the second conductive structure.

\* \* \* \* \*